United States Patent
Pong et al.

(10) Patent No.: US 10,852,359 B2
(45) Date of Patent: Dec. 1, 2020

(54) APPARATUS AND METHOD FOR DC-COMPONENT-BASED FAULT CLASSIFICATION OF THREE-PHASE DISTRIBUTION POWER CABLES WITH MAGNETIC SENSING

(71) Applicant: The University of Hong Kong, Hong Kong (CN)

(72) Inventors: Wing Tat Pong, Tsuen Wan (HK); Ke Zhu, Hong Kong (CN)

(73) Assignee: The University of Hong Kong, Hong Kong (CN)

( * ) Notice: Subject to any disclaimer, the term of this patent is extended or adjusted under 35 U.S.C. 154(b) by 121 days.

(21) Appl. No.: 15/831,558

(22) Filed: Dec. 5, 2017

(65) Prior Publication Data

US 2019/0170801 A1    Jun. 6, 2019

(51) Int. Cl.
| | |
|---|---|
| *G01R 31/50* | (2020.01) |
| *G01R 31/08* | (2020.01) |
| *G01R 15/20* | (2006.01) |
| *H02H 1/04* | (2006.01) |
| *G01R 19/165* | (2006.01) |
| *H02H 3/50* | (2006.01) |
| *G01R 31/00* | (2006.01) |

(52) U.S. Cl.
CPC ............. *G01R 31/50* (2020.01); *G01R 15/20* (2013.01); *G01R 31/083* (2013.01); *G01R 31/085* (2013.01); *G01R 19/16571* (2013.01); *G01R 31/001* (2013.01); *G01R 31/086* (2013.01); *H02H 1/04* (2013.01); *H02H 3/50* (2013.01)

(58) Field of Classification Search
CPC ....... G01R 31/001; G01R 31/086; H02H 3/50
See application file for complete search history.

(56) References Cited

U.S. PATENT DOCUMENTS

| | | | | |
|---|---|---|---|---|
| 7,714,567 B2* | 5/2010 | Heger | ................... | G01R 15/148 324/117 R |
| 2003/0083756 A1* | 5/2003 | Hsiung | .................. | G05B 15/02 700/28 |
| 2004/0179738 A1* | 9/2004 | Dai | ........................ | G06T 7/0002 382/218 |

(Continued)

OTHER PUBLICATIONS

Huisheng Wang and W. W. L. Keerthipala, Title: Fuzzy-Neuro Approach to Fault Classification for Transmission Line Protection ( IEEE Transactions on Power Delivery, vol. 13, No. 4, Oct. 1998). (Year: 1998).*

(Continued)

*Primary Examiner* — Alvaro E Fortich
(74) *Attorney, Agent, or Firm* — Leason Ellis LLP

(57) ABSTRACT

A DC-component-based fault classification apparatus and method for a three-phase power distribution cable utilizes the reconstructed three-phase currents by measuring the magnetic field around the cable with an array of magnetic sensors arranged around the cable surface. A magnetic shield houses the magnetic sensors and blocks background magnetic fields. A data acquisition system acquires analog signals from the sensors and a processing system extracts DC components in the analog signals for the phases during the transient period after a fault. The potential DC components are extracted by mathematical morphology. These DC components arise in the faulted phases when a fault occurs since there is a large current change in the inductive power network.

10 Claims, 3 Drawing Sheets
(2 of 3 Drawing Sheet(s) Filed in Color)

(56) References Cited

U.S. PATENT DOCUMENTS

| | | | | |
|---|---|---|---|---|
| 2009/0251308 | A1* | 10/2009 | Schweitzer, III | G01R 31/025 340/539.1 |
| 2010/0148766 | A1* | 6/2010 | Weischedel | G01N 27/9033 324/238 |
| 2011/0184671 | A1* | 7/2011 | Abiprojo | H02H 3/50 702/58 |
| 2011/0216453 | A1* | 9/2011 | Haines | H02H 9/00 361/49 |
| 2013/0187637 | A1* | 7/2013 | Saxby | G01R 21/00 324/127 |
| 2013/0334373 | A1* | 12/2013 | Malone, Jr. | B61L 1/187 246/2 R |
| 2014/0254050 | A1* | 9/2014 | Haines | H02H 3/162 361/42 |
| 2015/0084617 | A1* | 3/2015 | Popovic | G01R 15/207 324/127 |
| 2016/0352262 | A1* | 12/2016 | Kataoka | H02P 29/032 |

OTHER PUBLICATIONS

Z. Lu, T.Y. Ji and Q.H. Wu, Title: Morphological transform for removal of exponentially decaying DC-offset (Electronics Letters Apr. 24, 2008 vol. 44 No. 9). (Year: 2008).*

Wael M. Al-hasawi, et al., "A Neural-Network-Based Approach for Fault Classification and Faulted Phase Selection," 1996, IEEE Conference on Electrical and Computing Engineering, pp. 384-387.

Z. Bo, et al., "A New Approach to Phase Selection Using Fault Generated High Frequency Noise and Neural Networks," IEEE Transactions on Power Delivery, vol. 12, No. 1, Jan. 1997, pp. 106-115.

Andre de Souza, Gomes, et al., "Detection and Classification of Faults in Power Transmission Lines Using Functional Analysis and Computational Intelligence," IEEE Transactions on Power Delivery, vol. 28, No. 3, Jul. 2013, pp. 1402-1413.

A.S. Youssef, "Combined fuzzy-logic wavelet-based fault classification technique for power system relaying," IEEE transactions on power delivery, vol. 19, pp. 582-589, 2004.

K. M. Silva, et al., "Fault detection and classification in transmission lines based on wavelet transform and ANN," IEEE Transactions on Power Delivery, vol. 21, pp. 2058-2063, 2006.

V. Kale, et al., "Faulted phase selection on double circuit transmission line using wavelet transform and neural network," Third International Conference on Power Systems, Kharagpur, 2009, 6 pages.

Hongchun Shu, et al., "Fault Phase Selection and Distance Location Based on ANN and S-transform for Transmission Line in Triangle Network," 3rd International Congress on Image and Signal Processing, 2010, pp. 3217-3219.

* cited by examiner

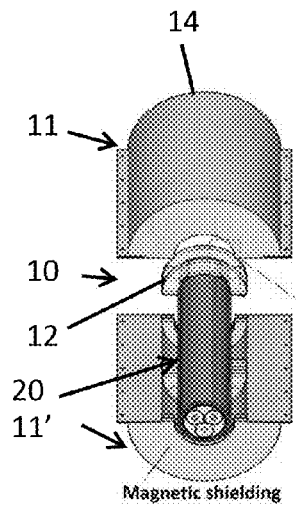 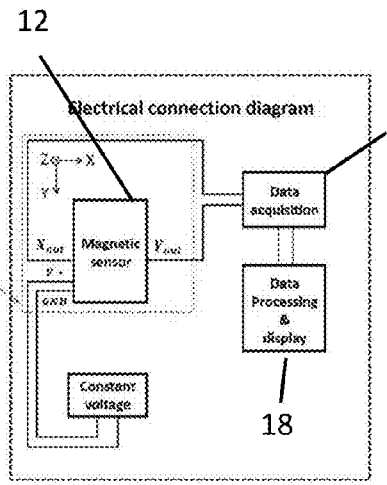 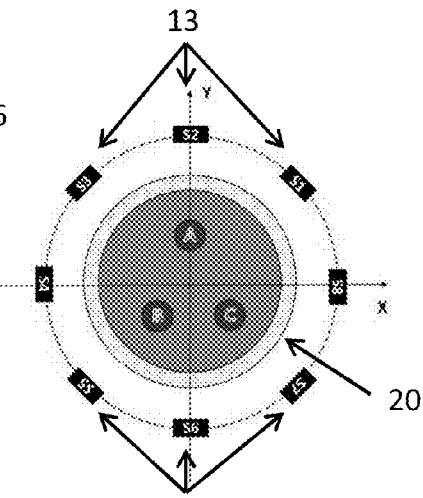
FIG. 1A  FIG. 1B  FIG. 1C
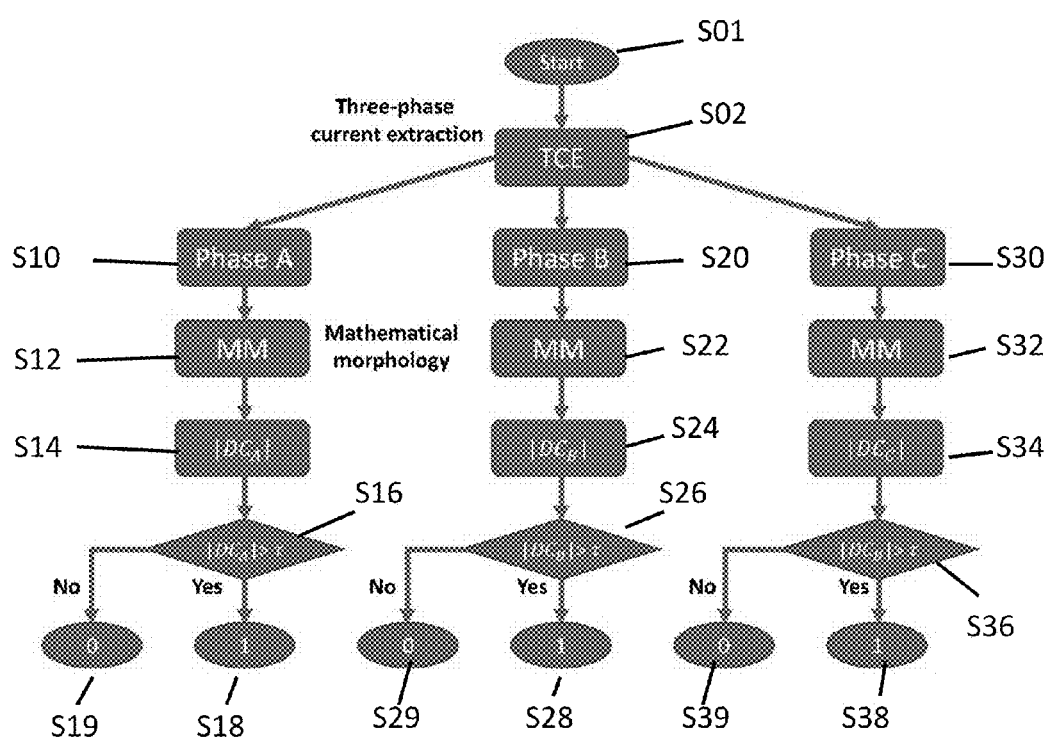
FIG. 2

| Short-circuit fault type | | $|DC_A|>\varepsilon$ | $|DC_B|>\varepsilon$ | $|DC_C|>\varepsilon$ | Remark on DC component |
|---|---|---|---|---|---|
| Single-phase-to-ground | AG | 1 | 0 | 0 | |
| | BG | 0 | 1 | 0 | |
| | CG | 0 | 0 | 1 | |
| Phase-to-phase | AB | 1 | 1 | 0 | Opposite polarity |
| | AC | 1 | 0 | 1 | |
| | BC | 0 | 1 | 1 | |
| Phase-phase-to-ground | ABG | 1 | 1 | 0 | Identical polarity |
| | ACG | 1 | 0 | 1 | |
| | BCG | 0 | 1 | 1 | |
| Three-phase | ABC | 1 | 1 | 1 | |

FIG. 5

APPARATUS AND METHOD FOR DC-COMPONENT-BASED FAULT CLASSIFICATION OF THREE-PHASE DISTRIBUTION POWER CABLES WITH MAGNETIC SENSING

TECHNICAL FIELD

The present invention relates to an apparatus and method for the classification of short-circuit fault conditions in three-phase power distribution cables, and more particularly, to the classification with magnetic sensing based on identifying the existence of DC component in phases during the transient status after the fault occurrence.

BACKGROUND OF THE INVENTION

A reliable power distribution system is needed to ensure the quality of power delivered to customers. Although power distribution cables are deployed underground, instead of being located overhead, in order to avoid harsh weather conditions and for aesthetic purposes, faults are still common on these underground distribution cables due to internal insulation breakdown, or external damage. For example, a phase-to-ground short-circuit fault occurs when the insulation breakdown, resulting in physical contact between phase conductors and the grounded screen. There can also be a phase-to-phase short-circuit fault because the insulation among conductors can breakdown due to moisture. Depending on the quantity of faulted phases involved and the grounded condition, the faults can be classified as (1) a phase-to-ground short-circuit fault; (2) a phase-to-phase short-circuit fault; (3) a phase-phase-to-ground short-circuit fault; and (4) a three-phase short-circuit fault. The consequence of short-circuit faults can be very serious. Thus, faults should be cleared by relays within the shortest possible time in order to reduce their adverse effects.

A short-circuit fault in a power system can result in very serious consequences, such as (1) the fire and explosion caused by excessive heating at the fault point and along the transmission/distribution lines; (2) the heating and electrodynamic force on system elements, which can damage them and reduce their service life; and (3) huge economical loss for the customers and industrial companies because of weak voltage supply; and (4) the breakdown of the power system due to cascade tripping of circuit breakers and even compete system or grid shutdown because the paralleled operating power network may also be affected and oscillated.

Since the years when the power system was initially established, there have been adopted a series of steady-state fault-classification methods including a current (voltage) peak method and an impedance method. When a short-circuit fault occurs, the current increases to a large value while the voltage drops to a small value. By setting a threshold for the current peak method and the voltage peak method, the faulted phase can be identified by judging if the threshold is reached. The impedance method is used to achieve a higher sensitivity by defining a ratio of phase voltage to current. Nevertheless, these methods are slow because the transient duration can last for around 5 cycles, while the ultra-high speed protection scheme requires fast fault classification, e.g., within 1-2 cycles. More recently, a number of transient-state fault-classification methods have been proposed in order to improve the fault-classification speed to satisfy the requirement of the ultra-high speed protection scheme for minimizing the adverse effects of faults. For example, the team of Al-hassawi proposed a Phase Difference Method to compare the measured phase current (voltage) difference of three phases with the pre-analyzed fault result. Al-hassawi et al., "A neural-network-based approach for fault classification and faulted phase selection," *IEEE Conference on Electrical and Computing Engineering* (1996). Bo et al developed the High-Frequency Noise (60 kHz) method to detect the existence of 60 kHz high-frequency noises in the faulted phases for identifying them. Bo et al., "A new approach to phase selection using fault generated high frequency noise and neural networks," *IEEE Transaction on Power Systems*, vol. 12, pp. 106-115 (1997). In 2013 the group of de Souza Gomes proposed the Angular Difference Method to measure the angular difference of positive- and negative-current of each phase, and compare with that in the faulted conditions in pre-analysis. De Souza et al., "Detection and classification of faults in power transmission lines using functional analysis and computational intelligence," *IEEE Transactions on Power Delivery*, vol. 28, pp. 1402-1413 (2013). The Wavelet Spectrum of Current Method was also proposed in 2004 to compare the wavelet spectrum between faulted and healthy phases. Youssef, "Combined fuzzy-logic wavelet-based fault classification technique for power system relaying," IEEE Transactions on Power Delivery, vol. 19, pp. 582-589 (2004). Shu et al developed a High-Frequency Energy (10-20 kHz) Method to detect the energy spectrum between faulted and healthy phases. Shu et al., "Fault phase selection and distance location based on ANN and S-transform of transmission line in triangle network," $3^{rd}$ *International Conference on Image and Signal Processing* (2010). However, there remain shortcomings such as (1) the pre-calibration; (2) invulnerability of electromagnetic interferences, and (3) the malfunction between the normal status and three-phase short-circuit fault. The detailed shortcoming of each method is listed in Table I, and the effects of these shortcomings are obvious as follows:

(1) Pre-calibration request: This accounts for 30% of the capital cost of the manpower for setting relay thresholds. This cost is becoming increasingly daunting as the world electricity consumption and power distribution network drastically expand.

(2) Vulnerability of EMI: This may lead to erroneous fault classification attributable to the electromagnetic coupling between the faulted and healthy phases. This problem becomes even more severe with the current larger deployment of high-frequency electronic devices.

(3) Malfunction: Some techniques may fail to identify faults because the three-phase short-circuit fault is still symmetrical like normal operation. The relay would not be tripped and the fault might be expanded, resulting in a very daunting consequence.

TABLE I

Comparison between traditional fault classification methods

| Method | No need for pre-calibration | Applicable for a three-phase short circuit | No existence of EMI | Reasons |
|---|---|---|---|---|
| Phase difference method | √ | x | √ | Three-phase short-circuit fault can be mistaken as a phase-to-phase short-circuit fault. |
| High-frequency noise (60 kHz) | √ | √ | x | Healthy phases can exhibit the features of the faulted phases due to high-frequency electromagnetic coupling among phases. |
| Angular difference method | √ | x | √ | Angular differences between the three phases are still symmetrical in a three-phase short-circuit fault. |
| Wavelet spectrum of current method | x | √ | x | (1) Wavelet spectrum depends on system configuration. (2) EMI in the power system can affect the wavelet spectrum pattern. |
| High-frequency energy (10-20 kHz) method | x | √ | x | (1) Spectrum pattern (10-20 kHz) depends on the system configuration. (2) EMI in the power system can introduce high-frequency signals (10-20 kHz) in healthy phases. |

Thus, in order to trip the relays with proper protection schemes, a very critical step after detecting the fault is to classify the fault types. Though there are a number of transient methods to classify the fault in the post-fault conditions, there still lacks a fault classification method that does not require pre-calibration, is invulnerable to EMI, and can reliably identify three-phase short-circuit fault.

SUMMARY OF THE INVENTION

The present invention is directed to the essential knowledge as to how to classify a short-circuit fault type (phase-to-ground short-circuit fault, phase-phase-to-ground short-circuit fault, phase-to-ground short-circuit fault, and three-phase short-circuit fault) in the transient-status duration after the fault occurs, which is critical for isolating the fault and recovering the power system.

The purpose of our invention is to overcome the above mentioned problems for further improving the fault classification. The invention relies upon detecting decaying DC components of currents in faulted phases by magnetic sensing. It is a non-invasive system that can be added to the existing power distribution cables. To make use of the decaying DC component for fault classification has the following advantages. First, no pre-calibration is required to initialize relays for different distribution power networks because this method does not need to determine a threshold based on the pre-fault status. Second, the DC component is robust because the EMI in the power system is of high frequency (>kHz), so the EMI itself does not overlap in the frequency bandwidth with the DC. Last but not least, the DC component is reliable to distinguish the three-phase short-circuit fault from the normal status because the DC component only arises under the fault condition. Therefore, adopting the DC component for fault classification is more advantageous than the traditional methods.

This invention provides an apparatus and method capable of enhancing the reliability, reducing the manpower cost and increasing the safety of serviceman regarding fault classification. According to an embodiment of the invention, an apparatus is provided for measuring the magnetic field around a three-phase power distribution cable surface. The apparatus includes a magnetic sensor array, multi-layered magnetic shielding made of high-permeability material and a data acquisition and processing system.

The operational method of this embodiment classifies the fault (i.e., phase-to-ground short-circuit fault, phase-phase-to-ground short-circuit fault, phase-to-ground short-circuit fault, and three-phase short-circuit fault) after the fault occurs by judging the existence of a decaying DC component in the current of the faulted phases during the transient period just after the fault. First, the three-phase current is reconstructed from the measured magnetic fields around the cable surface via an inverse current program (ICP), magnetic field evaluation (MFE) and source position optimization (SPO). Second, the DC component is extracted from the three-phase currents, respectively, after the fault occurs every ¼ cycle. Third, the fault type is identified through a pre-set logic table.

As described above, according to the present invention, the reliability of fault classification is improved because the method of the present invention solves the problems of vulnerability to EMI and the malfunction of three-phase fault identification. The DC component is robust because the EMI in the power system is of high frequency (>kHz) and thus it does not overlap with the DC component. The DC component is reliable in distinguishing the three-phase short-circuit fault from normal status because the DC component only arises under the fault condition.

In addition, according to the present invention, the cost of fault classification based on the apparatus is also reduced for the following two reasons:

(1) No pre-calibration is required to initialize relays for different distribution power networks because this method does not need to determine a threshold based on the pre-fault status, thus saving the financial investment in manpower to perform pre-calibration.

(2) The apparatus adopts magnetic sensors to reconstruct the flowing three-phase currents. There are magnetic sensors (e.g. magneto-resistive sensors such as anisotropy magneto-resistive sensors, giant magneto-resistive sensors, or tunneling magneto-resistive sensors) which are off-the-shelf and of low-cost (~several to tens USD for each), compared to the existing optical current transformers (OCTs) which are bulky (~m³) and high-cost (~USD 10k).

Last but not least, the safety of serviceman is enhanced compared to installing and operating traditional Hall-effect voltage sensors. The Hall-effect voltage sensor is based on the Hall Effect and magnetic compensation principle. The sensing circuit must make contact with the wires on the primary side. This configuration requires contact with the high-voltage side (330 kV to 1,000 kV), which jeopardizes the safety of the serviceman. The present invention solves this problem because the sensing is non-invasive and it does not need to make contact with the wires.

Compared to the prior methods set forth in Table I, the present invention does not need pre-calibration, can be used for three-phase short circuit detection and is not affected by electromagnetic interference (EMI).

Thus the present invention provides a more reliable fault classification to (a) ensure the proper function of relays, (b) boost the self-healing ability of distribution systems so as to realize a smart grid, (c) save on the manpower needed for pre-calibration and (d) control the adverse effects of faults to facilitate the development of a smart city.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing and other objects and advantages of the present invention will become more apparent upon reference to the following detailed description and annexed drawings in which like designations denote like elements in the various views, and wherein:

FIG. 1A is a graphical representation of apparatus for measuring magnetic field around a three-phase power distribution cable according to the present invention, FIG. 1B is a circuit schematic for the apparatus of FIG. 1A and FIG. 1C is a cross-sectional view of a three-phase distribution cable showing the placement of a magnetic sensor array;

FIG. 2 is a flowchart of a method for fault classification utilizing the apparatus of FIG. 1 according to the present invention;

FIGS. 4A-4C are exemplary illustration of DC current component extraction during the transient period after the acquisition of the three-phase currents, wherein FIG. 4A shows the extracted and real DC components in the currents for phase-to-ground short-circuit fault (A-G), FIG. 4B shows the phase-to-phase short-circuit fault (B-C), FIG. 4C shows the phase-phase-to-ground short-circuit fault (B-C-G), FIG. 5 is a logic table to identify the short-circuit fault types (i.e., phase-to-ground short-circuit fault, phase-phase-to-ground short-circuit fault, phase-to-ground short-circuit fault, and three-phase short-circuit fault).

DETAILED DESCRIPTION OF THE INVENTION

Figure 3:
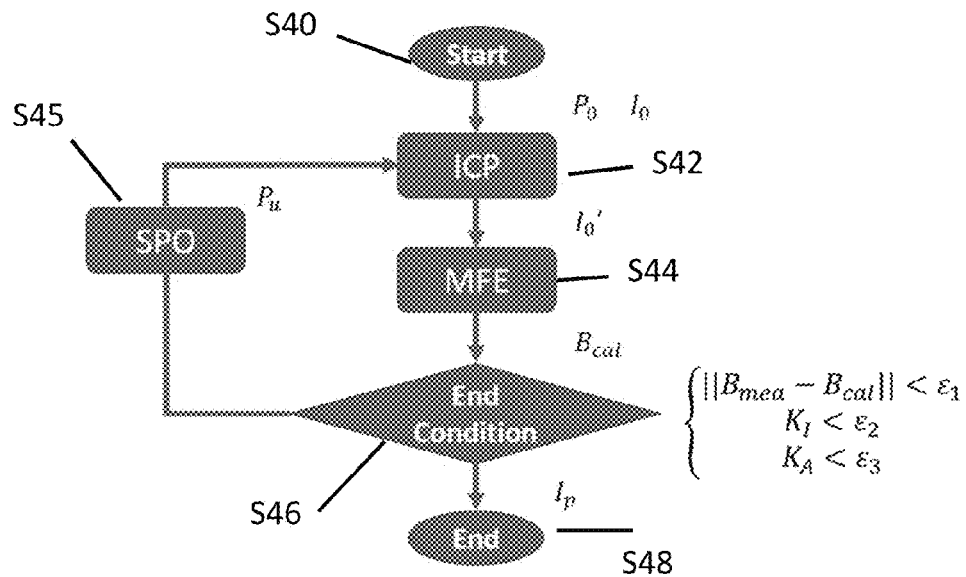
FIG. 3 is a flowchart of a three-phase current extraction (TCE) process used in the method of FIG. 2.
Figure 4A:
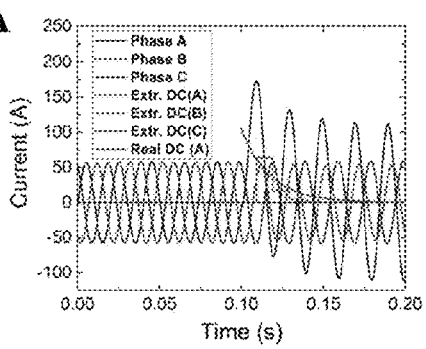
Figure 4B:
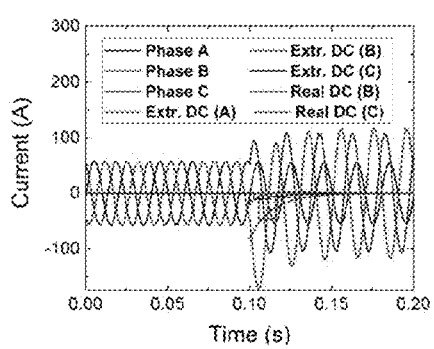
Figure 4C:
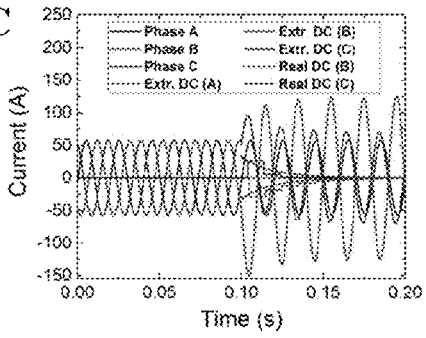
Figure 4D:
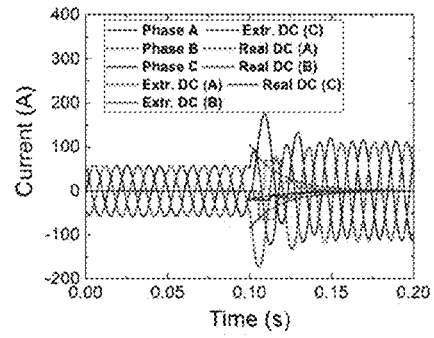
FIG. 4D shows the three-phase short-circuit fault (A-B-C)

The invention relates to an apparatus and method for fault classification of three-phase distribution power cables. It relies on magnetic sensing to identify the existence of DC components in power phases during the transient period after the fault, thus avoiding the problem of waveform distortion which could be incurred by the DC bias of current transformers if the DC component were detected using existing transducers in the power system, which most commonly are current transformers. Current transformers cannot be used since the DC current inversely results in DC bias in the transformers, distorting the secondary output current waveform. While optical current transformers (OCS) based on magneto-optic effect (Faraday effect) could be used, they are very expensive.

The apparatus 10 for measuring the magnetic field around a three-phase power distribution cable 20 is shown in FIG. 1 separated into upper and lower portions 11, 11'. The apparatus includes a magnetic sensor array 12, magnetic shielding 14, a data acquisition unit 16 (FIG. 1B), and a data processing & display unit 18 (FIG. 1B). The magnetic sensors 13 (S1-S8 shown in FIG. 1C) of the sensor array 12 are installed in a circular arrangement for measuring the magnetic fields at various azimuths around the cable 20 surface. They are located with respect to the phase conductors A, B, C of FIG. 1C. In order to measure the magnetic fields generated from the three-phase power cable as accurate as possible, a triple-layered magnetic shield 14 made of high-permeability material is located so as to surround the sensors. The shield 14 protects the sensors from background magnetic interference, which may affect the accuracy of the measured magnetic fields generated from the target cable.

The analog outputs of the magnetic sensors 13 are collected by the data acquisition unit 16. The collected signals are then processed by data processing unit 18 to extract DC components in the phases during the transient period after a fault. The computer also displays the components.

The program to extract and identify the existence of DC components in the phases is shown in FIG. 2. The program starts at step S01 with the measured magnetic fields around the cable surface, which are then processed by Three-phase Current Extraction (TCE) sub-program S02, which is shown in more detail in FIG. 3. The essence of TCE is a stochastic optimization method, in which the three-phase currents and the position of the cable conductors are determined by optimization. In particular, the final phase currents are determined by optimizing minimal Euclidean distance between the measured and calculated magnetic fields. By reconstructing the DC components from magnetic sensing, the problem of waveform distortion incurred by the DC bias of current transformers is avoided.

The reconstructed three-phase currents are shown in FIG. 2 as steps S10 (Phase A), S20 (Phase B) and S30 (Phase C). Then each of the reconstructed three-phase currents are processed by the mathematical morphology (MM) method at steps S12, S22, S32 to analyze the DC components per ¼ cycle. The extracted DC component of each phase (i.e., $|DC_A|$, $|DC_B|$ and $(|DC_C|)$ at steps S14, S24, S34 are compared to a pre-set threshold ($\tau$) in steps S16, S26, S36. The threshold ($\tau$) is set because there can be some small DC currents flowing in the system from the renewable energy system and high-voltage-direct-current (HVDC) transmission line system via the grounding points in the AC system. If the condition is satisfied, the indicator in the respective phase would show "1" at steps S18, S28, S38; otherwise the comparison would show "0" at steps S19, S29, S39.

FIG. 3 describes the details of the TCE program according to step S02 in FIG. 2. The TCE starts at step S40 with a default setting of current ($I_0$) and positions ($P_0$) of the three-phase conductors. In order to expedite the optimization and find the most feasible solution, the preliminary currents would be set as the rating currents of the power distribution cable. Meanwhile, the position of the three-phase conductors would be set at the angular positions where the three peaks are located in the magnetic-field-distribution pattern measured in a whole circle around the cable surface. In the inverse current program (ICP), the current is optimized by the least square method ($I_0'$) in step S42. The calculated magnetic fields ($B_{cal}$) are then updated by the magnetic field evaluation (MFE) program with the optimized current ($I_0'$) and pre-set position ($P_0$) at step S44. The end conditions at step S46 are as follows: (a) the Euclidian distance between the calculated ($B_{cal}$) magnetic field and the measured ($B_{mea}$) magnetic field is smaller than the pre-set threshold ($\varepsilon_1$); (b) the current imbalance degree ($K_I$) is smaller than the pre-set value ($\varepsilon_2$, e.g. 10%); and (c) the angle imbalance degree is smaller than the pre-set value ($\varepsilon_3$, e.g. 20%). The algorithm terminates and outputs the reconstructed three-phase conductor position ($P_f$) and current ($I_p$) at step S48.

If the end conditions are not met, the conductor positions are optimized ($P_u$) by source position optimization (SPO) at step S45 in which a genetic algorithm is used. The iteration continues to optimize the position and currents of the three-phase conductors until the end conditions are satisfied. Then the optimized currents ($I_p$) would be accepted as the three-phase currents. Because the positions of three-phase conductors A, B, C are fixed, the three-phase position can be reserved for executing the program the next time. The algorithm of FIG. 3 is operated per quarter of a cycle to extract the DC components for achieving a fast response.

The fault classification method of the present invention is critical for tripping the relays for isolating the faulted areas, or to make an overall decision for auto-reclosing on specific phases.

FIGS. 4A-4D are exemplary illustrations of DC component extraction during the transient phase after the acquisition of the three-phase currents. The tested power distribution network consisting of a feeder (voltage: 22 kV; short-circuit capacity, 2.2 MVA; inductance, 0.35 H; resistance, 13.96Ω), a 20-km distribution power cable (resistance $r_1$=0.024 Ω/km, $r_0$=0.412 Ω/km; induction $l_1$=0.4278 mH/km, $r_0$=1.5338 mH/km; capacitance $c_1$=0.2811 μF/km, $c_0$=0.1529 μF/km) and the loading (1 MW). The fault is assumed to have occurred at 10 km away from the feeder side at 0.10 s for all fault types, i.e., phase-to-ground short-circuit fault (A-G) in FIG. 4A, phase-to-phase short-circuit fault (B-C) in FIG. 4B, phase-phase-to-ground short-circuit fault (B-C-G) in FIG. 4C, and three-phase short-circuit fault (A-B-C) in FIG. 4D. For the illustration shown in FIGS. 4A-4D the MM method was applied to extract the DC component of three-phase current in the post-fault period. The result shows that the DC components only arise in the faulted phases, and the ones extracted by MM method matched with the accurate values in the faulted phases.

The logic table of fault classification of the power distribution cable is shown in FIG. 5. According to the flowchart in FIG. 2, the faulted phase would be reported as a "1," otherwise "0". The single-phase-to-ground short-circuit fault and three-phase short-circuit fault can be easily identified by judging the existence of logic indication "1" in respective phases, namely, A-G (1-0-0), B-G (0-1-0), C-G (0-0-1), and A-B-C (1-1-1). Two logic "1" indications are shown in either phase-to-phase short-circuit fault or phase-phase-to-ground short-circuit fault. However, since the short-circuit current direction is different (i.e., currents would be flowing between phases in phase-to-phase short-circuit fault, and into the ground in the phase-phase-to-ground short-circuit fault), the DC component would also be different. Therefore, the polarity of the DC components can be used to further distinguish the fault types. The opposite polarity of DC components is for the phase-to-phase short-circuit fault, and the identical polarity is for the phase-phase-to-ground short-circuit fault.

The benefits of the present invention are (1) reliability enhancement of fault classification in distributed networks for ensuring the proper function of relays and reducing the time needed for repair; (2) the elimination of manpower costs in terms of a pre-calibration process for installing relays on each underground power cable for achieving a more cost-effective power system upgrade; and (3) the facilitation of Smart Grid construction by improving the self-healing ability in distribution systems. The reliability is enhanced by tripping the proper relays consistent with the protection scheme (e.g., single-phase re-closing) to reduce the adverse effects of faults. The accurate fault classification is critical for calculation of the distance from the relay to the fault point, saving the time to locate and repair the fault by service personnel. Self-healing in a Smart Grid also requires pinpointing the faulted point as accurately as possible. With accurate fault location based on the correct fault classification, the faults can be isolated in a minimal area, or the network can be re-configured in a fast way to sustain the customers with optimized alternative power supplies.

Further, the system of the present invention is cost effective in that its magnetic sensors are less expensive than optical current transformers. The system of the present invention is also fast, establishing classification in one single cycle, while the prior art requires several cycles.

Specific features of the invention are shown in one or more of the drawings for convenience only, as each feature may be combined with other features in accordance with the invention. Alternative embodiments will be recognized by those skilled in the art and are intended to be included within the scope of the claims. Accordingly, the above description should be construed as illustrating and not limiting the scope of the invention. All such obvious changes and modifications are within the patented scope of the appended claims.

We claim:

1. An apparatus for short-circuit fault classification of a three-phase power distribution cable, comprising:
    at least three magnetic sensors, wherein the magnetic sensors are arranged in a circular way to form an array about the cable;
    a magnetic shield to house the magnetic sensors and to block external magnetic fields;
    a data acquisition system for acquiring analog signals from the magnetic sensors; and
    a processing and display system to extract DC components in the analog signals for phases during a transient period after a short-circuit fault and to display those DC components as an indication of the short-circuit fault classification.

2. The apparatus according to claim 1, wherein the magnetic sensors can be Hall-effect sensors, anisotropic magneto-resistance (AMR) sensors, tunnel magneto-resistance (TMR) sensors, giant magneto-resistance (GMR) sensors, or other compact magnetic sensors.

3. The apparatus according to claim 1, wherein the magnetic shield is multi-layered and made of high-permeability material.

4. A method of classifying short-circuit faults in a three-phase distribution power cable of a power system, comprising the steps of:

sensing a magnetic field around the cable surface with a plurality of magnetic sensors and producing signals related thereto;

applying three-phase current extraction (TCE) to reconstruct three-phase currents from the magnetic signals by a stochastic optimization method;

extracting a DC component from the reconstructed three-phase currents using mathematical morphology (MM); and classifying a short-circuit fault based on the extracted DC component.

5. The method according to claim 4, wherein the stochastic optimization method is comprised of inverse current program (ICP), magnetic field evaluation (MFE) and source position optimization (SPO).

6. The method according to claim 4 wherein the stochastic optimization method terminates when a Euclidean distance between measured and calculated magnetic fields is smaller than a pre-set threshold.

7. The method according to claim 5, wherein the ICP optimizes the three-phase currents through a least square method based on preset three-phase conductor positions and measured magnetic fields.

8. The algorithm according to claim 5, wherein the MFE calculates magnetic fields at sensing points of the plurality of magnetic sensors with preset three-phase conductor positions and optimized current.

9. The algorithm according to claim 5, wherein the SPO optimizes a three-phase conductor position by using a genetic algorithm.

10. The algorithm according to claim 4, wherein the step of classifying a short-circuit fault involves referencing a logic table of the possibilities of the existence of DC components in the sensed currents of the phases, and using the logic table to identify phase-to-ground short-circuit fault, phase-phase-to-ground short-circuit fault, phase-to-ground short-circuit fault, and three-phase short-circuit fault.

* * * * *